United States Patent
Wu et al.

(10) Patent No.: US 11,875,969 B2
(45) Date of Patent: Jan. 16, 2024

(54) PROCESS CHAMBER WITH REDUCED PLASMA ARC

(71) Applicant: Applied Materials, Inc., Santa Clara, CA (US)

(72) Inventors: Fei Wu, Sunnyvale, CA (US); Abdul Aziz Khaja, San Jose, CA (US); Sungwon Ha, Palo Alto, CA (US); Vinay K. Prabhakar, Cupertino, CA (US); Ganesh Balasubramanian, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 486 days.

(21) Appl. No.: 16/856,917

(22) Filed: Apr. 23, 2020

(65) Prior Publication Data
US 2020/0365370 A1    Nov. 19, 2020

Related U.S. Application Data

(60) Provisional application No. 62/848,281, filed on May 15, 2019.

(51) Int. Cl.
*H01J 37/32* (2006.01)
*H01J 37/34* (2006.01)

(52) U.S. Cl.
CPC .. *H01J 37/32055* (2013.01); *H01J 37/32899* (2013.01); *H01J 37/3435* (2013.01); *H01J 37/3438* (2013.01)

(58) Field of Classification Search
None
See application file for complete search history.

(56) References Cited

U.S. PATENT DOCUMENTS

| | | | |
|---|---|---|---|
| 8,980,049 B2* | 3/2015 | Lee | H01L 21/67069 |
| | | | 156/345.48 |
| 9,347,128 B2 | 5/2016 | Kimura et al. | |
| 2004/0072426 A1 | 4/2004 | Jung | |
| 2008/0180357 A1* | 7/2008 | Kawakami | H01J 37/32568 |
| | | | 345/60 |
| 2011/0294303 A1 | 12/2011 | Sankarakrishnan et al. | |
| 2012/0037314 A1* | 2/2012 | Endoh | H01J 37/32477 |
| | | | 156/345.34 |
| 2015/0262798 A1 | 9/2015 | Binns et al. | |
| 2016/0017494 A1* | 1/2016 | Ayoub | C23C 16/458 |
| | | | 118/723 R |

OTHER PUBLICATIONS

International Search Report and Written Opinion for PCT/US2020/029545 dated Aug. 11, 2020.

* cited by examiner

*Primary Examiner* — Jason Berman
(74) *Attorney, Agent, or Firm* — Patterson + Sheridan, LLP

(57) ABSTRACT

A processing system comprises a chamber body, a substrate support and a lid assembly. The substrate support is located in the chamber body and comprises a first electrode. The lid assembly is positioned over the chamber body and defines a processing volume. The lid assembly comprises a faceplate, a second electrode positioned between the faceplate and the chamber body, and an insulating member positioned between the second electrode and the processing volume. A power supply system is coupled to the first electrode and the faceplate and is configured to generate a plasma in the processing volume.

20 Claims, 5 Drawing Sheets

PROCESS CHAMBER WITH REDUCED PLASMA ARC

CROSS-REFERENCE TO RELATED APPLICATIONS

This application claims priority to U.S. Provisional Patent Application 62/848,281, filed on May 15, 2019, the disclosure of which is incorporated herein by reference in its entirety.

FIELD

Embodiments described herein relate to semiconductor manufacturing apparatus and methods. Specifically, embodiments described herein relate to plasma process chambers for semiconductor substrates.

BACKGROUND

Many processing systems employ a lid assembly including a stack of one or more insulating rings and one or more electrodes positioned on a chamber body of the processing system. During processing, deposition material may build up on the insulating rings, electrodes and/or in a gaps between electrodes and insulating rings. As the thickness of the deposition material increases, the localized high electric field increases, resulting in arcing within the chamber body. For example, charge accumulated on the surface of a substrate undergoing processing within the processing system may arc to material deposited adjacent the gap between the electrode and the insulating ring. Accordingly, arcing occurs within the process chamber. The arcing may deleteriously affect the substrate processing, resulting in the process chamber being taken off-line. Thus, the downtime of the processing system is increased, and the production rate is reduced.

Thus, there is a need for an improved processing system with reduced arcing.

SUMMARY

In one example, a process chamber comprises a chamber body, a substrate support disposed in the chamber body, and a lid assembly disposed over the chamber body and defining a processing volume. The lid assembly comprises a faceplate, an electrode and an insulating member. The insulating member is positioned between the electrode and the processing volume of the process chamber. Further, the electrode is positioned between the faceplate and the chamber body.

In one embodiment, a lid assembly for a processing system comprises a faceplate, an electrode, an insulting ring and an insulating member. The insulating member is positioned between the electrode and the insulating ring and a processing volume of the processing system. The electrode is positioned between the faceplate and a chamber body of the processing system.

In one embodiment, a process chamber comprises a chamber body, a substrate support, and a lid assembly. The substrate support is located in the chamber body and comprises a first electrode. The lid assembly is located over the chamber body and defines a processing volume within the chamber body. The lid assembly comprises a faceplate, a second electrode positioned between the faceplate and the chamber body, and an insulating member. The insulating member is positioned between the second electrode and the processing volume.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments described herein provide an apparatus for processing a semiconductor substrate. In many instances, when processing a substrate, one or more layers of materials are deposited on a surface of the substrate, and also on other surfaces of the processing system. For example, material may be deposited on an electrode of a lid assembly, an insulating ring of the lid assembly and/or a gap between the electrode and insulating ring. Over time, the thickness of the deposited material on the various surfaces of the processing chamber increases, increasing the probability of arcing occurring within the processing chamber. Arcing causes deleterious effects on substrate processing and/or on hardware components, increasing the frequency of scrapped substrates and maintenance downtime. Further, taking the corresponding processing system off-line results in decreased production rate of the processing system and increased corresponding production costs.

Arcing may occur when the deposition thickness on the electrode and the insulating ring is about 1.8 um, or greater. In many instances, the deposition capability for such a processing system is also about 1.8 um. Thus, in such processing systems, the probability of arcing occurring is high. However, limiting the deposition thickness to reduce arcing is difficult as a deposition capability of 1.8 um or less presents challenges for the generation of many modern semiconductor devices.

However, by including an insulating member between the electrode and the insulating ring and the processing volume of the processing system, material buildup on the electrode, the insulating ring and the gap between the electrode and the insulating ring is reduced or eliminated. Accordingly, the occurrence of arcing within the processing system is reduced, decreasing the down time of the processing system and increasing the production rate of the processing system. Further, the deposition capability of the corresponding processing system is also increased.

Figure 1:
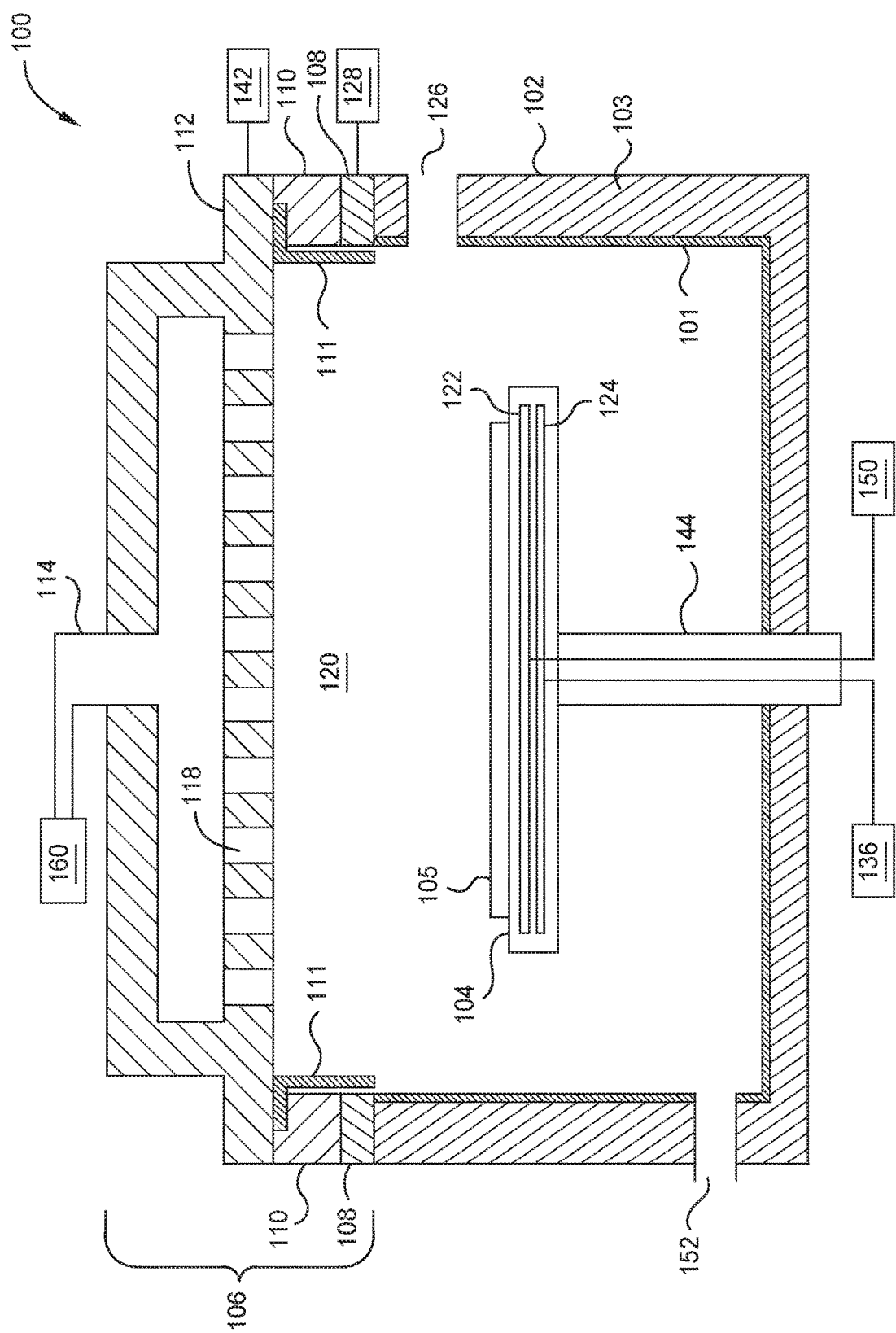
FIG. 1 is a schematic cross-sectional view of a processing system, according to one embodiment.

FIG. 1 is a schematic cross-sectional view of a process chamber 100 of a processing system, according to one or more embodiments. The process chamber 100 features a chamber body 102, a substrate support 104 disposed inside the chamber body 102, and a lid assembly 106 coupled to the chamber body 102 and enclosing the substrate support 104 in a processing volume 120. Substrates 105 are provided to the processing volume 120 through an opening 126, which may be sealed for processing using a door of a valve assembly (not shown). The process chamber 100 may be one a chemical vapor deposition (CVD) process chamber, an atomic layer deposition (ALD) process chamber, a metalorganic chemical vapor deposition (MOCVD) process chamber, a plasma-enhanced chemical vapor deposition (PECVD) process chamber, or a plasma-enhanced atomic layer deposition (PEALD) process chamber, among others.

The chamber body 102 includes a chamber wall 103. Further, a liner 101 may be located on the chamber wall 103, such that the liner 101 is between then the chamber wall 103 and the processing volume 120. The liner 101 may be comprised of aluminum. Alternatively, the liner 101 may be comprised of other conductive or insulating materials.

The lid assembly 106 includes electrode 108, insulating ring 110, and faceplate 112. Further, the lid assembly 106 comprises insulating member 111 positioned radially inward of the insulating ring 110 and the electrode 108. For example, the insulating member 111 is positioned between the insulating ring 110 and the electrode 108 and the processing volume 120 such that the surfaces of the insulating ring 110 and the electrode 108 are not exposed to the processing volume 120. The lid assembly 106 and substrate support 104 may be used with a process chamber configured for plasma or thermal processing.

The electrode 108 is disposed adjacent to the chamber body 102 and is positioned between the chamber body 102 and other components of the lid assembly 106. The electrode 108 is an annular, or ring-like member, and may be referred to as a ring electrode. The electrode 108 may be a continuous loop around a circumference of the process chamber 100 surrounding the processing volume 120, or may be discontinuous at selected locations. The electrode 108 may also be a perforated electrode, such as a perforated ring or a mesh electrode. In some examples, the electrode 108 may be electrically separated from the chamber body 102 by an electrically insulating material, such as a ceramic (e.g., insulating ring 310 of FIG. 3), positioned therebetween.

The insulating ring 110, which may be a dielectric material such as a ceramic or metal oxide, for example aluminum oxide and/or aluminum nitride, contacts the electrode 108 and separates the electrode 108 electrically and/or thermally from the faceplate 112.

The faceplate 112 features openings 118 for admitting process gas into the processing volume 120. The faceplate may be referred to as a showerhead. The faceplate 112 may be coupled to a power supply 142, such as an RF (radio frequency) generator, a direct current (DC) power supply, a pulsed DC power supply, and a pulsed RF power supply. Further, the power supply 142 drives the faceplate 112 with one of a pulsed DC signal, a pulsed RF signal and a ground voltage (or any other constant voltage) signal to generate a plasma in the processing volume 120.

The insulating member 111 is formed from a dielectric material, and shields the electrode 108 and the insulating ring 110 from the processing volume 120. For example, the insulating member 111 may be a ceramic or a metal oxide (e.g., aluminum oxide and/or aluminum nitride). The insulating member 111 forms a continuous loop around the inner diameter of the process chamber 100 surrounding the processing volume 120. Further, the insulating member 111 is formed from a single continuous material. Alternatively, the insulating member 111 may be formed from one or more materials, having one or more discrete sections. Additionally, the insulating member 111 is disposed above the liner 101 of the chamber body 102. For example, the insulating member 111 may be positioned between the liner 101 and the faceplate 112. Further, a distance between the insulating member 111 and the liner 101 is in a range of about 1 mm to about 20 mm. Alternatively, the distance between the insulating member 111 and the liner 101 may be less than 1 mm or greater than about 20 mm.

The insulating member 111 forms a barrier, separating the electrode 108 and the insulating ring 110 from the processing volume 120. The insulating member 111 protects the electrode 108 and the insulating ring 110 from process gases and thermal changes within the processing volume 120. For example, during substrate processing, material deposition occurs on the insulating member 111 instead of the electrode 108 and the insulating ring 110. Further, as deposition occurring on the electrode 108 and the insulating ring 110, or in the gap between the electrode 108 and the insulating ring 110, insulating member 111 is mitigated due to the presence of the insulating member 111, the overall probability for arcing within the process chamber 100 is reduced. Stated another way, the insulating member 111 reduces the thickness of the material deposited on the electrode 108 and the insulating ring 110, or in the gap between the electrode 108 and the insulating ring.

The faceplate 112 is a conductive gas distributor or a non-conductive gas distributor. The faceplate 112 is made of conductive and/or non-conductive components. In a plasma process chamber, the faceplate 112 may be powered, for example by the power supply 142, or the faceplate 112 may be coupled to ground.

The insulating member 111 may contact the faceplate 112. Alternatively, the insulating member 111 may be separated from the faceplate 112, for example by a ceramic spacer. In one embodiment, the insulating member 111 includes a radially extending lip 204 positioned between the insulating ring 110 and the faceplate 112. The lip 204 retains the insulating member 111 within the processing volume 120. In other embodiments, the insulating member 111 may be coupled to the faceplate 112 or another portion of the lid assembly 106, for example, using fasteners. Alternatively, the insulating member 111 may rest on another portion of the process chamber 100 to maintain the position of the insulating member 111 within the process chamber 100.

The electrode 108 may be coupled to a power supply 128. The power supply 128 may drive the electrode 108 with a power signal. The power signal may include an RF source or DC source. The power signal may be adjustable. For example, the magnitude of the voltage and/or sign of the voltage of the power signal may be varied. Further, the voltage of the power signal may be positive or negative.

An electrode 122 is part of the substrate support 104. The electrode 122 is embedded within the substrate support 104 or coupled to a surface of the substrate support 104. The electrode 122 may be a plate, a perforated plate, a mesh, a wire screen, or any other distributed arrangement. Further, the electrode 122 is coupled to a power supply 136 by a conduit, for example a cable, disposed in a shaft 144 of the substrate support 104.

The power supply 136 includes an electronic sensor and an electronic controller, which may be a variable capacitor. The electronic sensor may be a voltage or current sensor, and may be coupled to the electronic controller of the power supply 136 to provide further control over plasma conditions in the processing volume 120. The power supply 136 drives the electrode 122 with one of a pulsed DC signal, a pulsed RF signal and a ground voltage (or any other constant voltage) signal to generate a plasma in the processing volume 120. Further, the electrode 122 may be driven differently (e.g., oppositely) than the faceplate 112 to generate a capacitively-coupled plasma in the processing volume 120. For example, one of the faceplate 112 and the electrode 122 is driven with a pulsed RF signal and the other of the faceplate 112 and the electrode 122 is driven with a ground voltage signal. The power supplies 142 and 136 may be combined to form a power supply system. The power supply system may include the power supplies 142 and 136 and other power supplies.

An electrode 124, which may be a bias electrode and/or an electrostatic chucking electrode, is part of the substrate support 104. The electrode 124 is embedded within the substrate support 104 or coupled to the substrate support 104. Further, the electrode 124 is coupled to the power supply 150. For example, the electrode 124 is coupled to the power supply 150 through a filter, which may be an impedance matching circuit. The power supply 150 provides one or more of a DC power, pulsed DC power, RF power, pulsed RF power.

In operation, the process chamber 100 may provide real-time control of plasma conditions in the processing volume 120. The substrate 105 is positioned on the substrate support 104, and process gases are flowed through the lid assembly 106 using an inlet 114 from a gas supply 160 according to any desired flow plan. Gases exit the process chamber 100 through an outlet 152. For example, a vacuum pump may be coupled to the outlet 152.

While the embodiment of FIG. 1 illustrates a lid assembly 106 including the insulating ring 110, the electrode 108 and the insulating member 111, it is contemplated that the electrode 108 and the insulating ring 110 may be omitted.

Figure 2A:
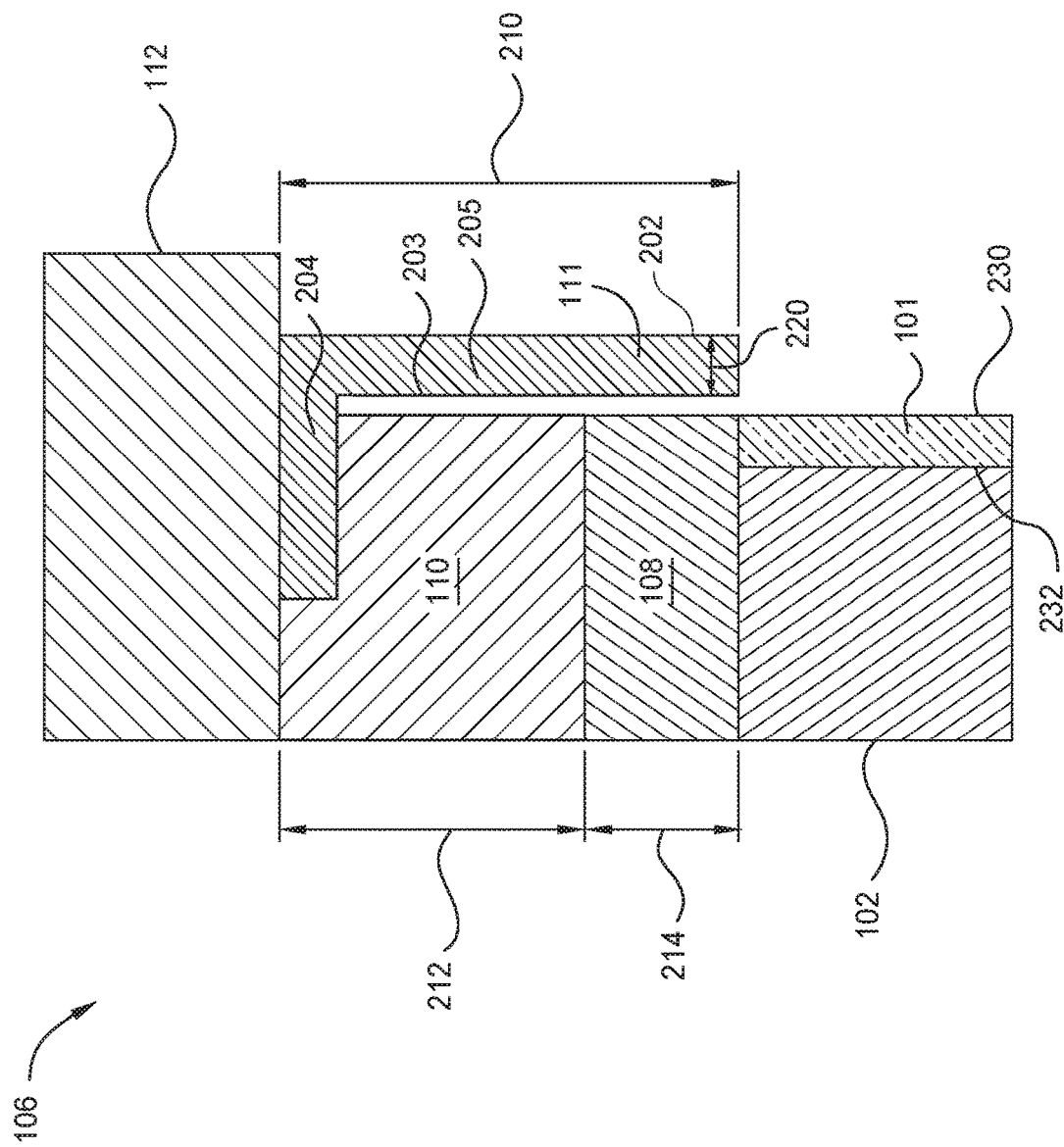
FIG. 2A is a schematic cross-sectional view of a portion of the processing system, according to one embodiment.

FIG. 2A is a schematic cross-sectional view of a portion 106 of the process chamber 100, according to one or more embodiments. The insulating member 111 includes surface 202, surface 203, and lip 204. The surface 203 faces the electrode 108 and the insulating ring 110, e.g., the surface 203 is oriented radially outward. Further, the surface 203 is not in contact with the electrode 108 and the insulating ring 110, forming a small uniform gap between the surface 203 and the electrode 108 and the insulating ring 110. The surface 202 faces the processing volume 120, e.g., the surface 202 is oriented radially inward. The gap between the surface 203 and the electrode 108 and the insulating ring 110 is less than about 1 mm. Further, the gap between the surface 203 and the electrode 108 and the insulating ring 110 may be less than about 0.5 mm. For example, the gap may be about 0.1 mm to about 0.5 mm. In one embodiment, the gap between the surface 203 and the electrode 108 and the insulating ring 110 is omitted and the surface 203 contacts the electrode 108 and the insulating ring 110. The gap between the surface 203 and the electrode 108 and the insulating ring 110 accommodates thermal expansion during processing. The size of the gap between the surface 203 and the electrode 108 and the insulating ring 110 mitigates processing gases from contacting the electrode 108 and the insulating ring 110, mitigating arcing that may occur due to the deposition of materials on the electrode 108 and the insulating ring 110. In such a manner, the insulating member 111 functions as a deposition shield.

The lip 204 of the insulating member 111 is positioned between the insulating ring 110 and the faceplate 112. The lip 204 aids in retaining the insulating member 111 within the processing volume 120 of the process chamber 100. In one or embodiments, the lip 204 may be omitted. In another example, the lip 204 may include one or more protrusions on the upper or lower surfaces thereof. The protrusions may index with corresponding recesses formed in the upper surface of the insulating ring and/or the lower surface of the faceplate 112.

Figure 2B:
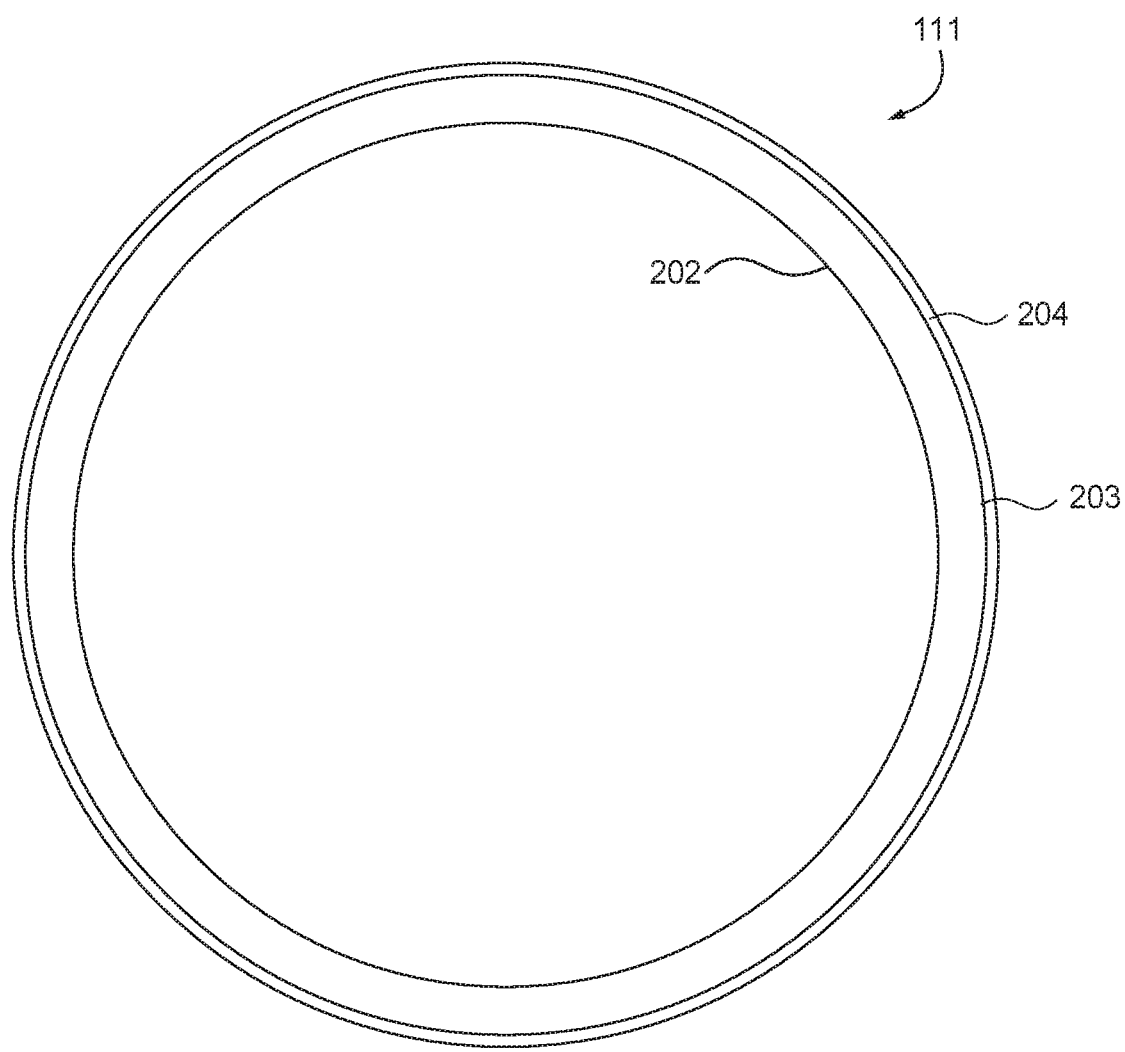
FIG. 2B is a bottom plane view of an insulating member, according to one embodiment.

FIG. 2B is a top plan view of the insulating member 111. As illustrated in FIG. 2B, the insulating member 111 has a circular shape, and includes a cylinder having a lip. As is described above, the insulating member 111 includes the lip 204 positioned along the perimeter of the insulating member 111. The lip 204 is a ring-shaped member disposed in a plane. The lip 204 is utilized to secure the insulating member 111 within the process chamber 100. For example, the lip 204 of the insulating member 111 is positioned between insulating ring 110 (or the electrode 108 in embodiments that omit the insulating ring) and the faceplate 112. The lip 204 extends radially outward from a cylinder 205 of the insulating member 111 at a distal end of the cylinder. The lip 204 is positioned at a right angle relative to the cylinder (e.g., a sidewall or an axial centerline of the cylinder).

During substrate processing, material deposition occurs on the surface 202 of the insulating member 111 instead of the electrode 108 and the insulating ring 110, and the gap between electrode 108 and the insulating ring 110. Accordingly, the buildup of deposited material between the electrode 108 and the insulating ring 110 is reduced, reducing the probability that an electrical field will arc across the gap between the electrode 108 and the insulating ring 110 and discharge. The insulating member 111 protects the electrode 108 and the insulating ring 110 from the process gases and thermal changes within the processing volume 120. Additionally, the surface 202 is smooth such that any material deposition that occurs on the surface 202 is uniform and may be removed during a cleaning cycle. The surface 202 may be smooth such that the build-up of deposited material is substantially uniform across the surface 202. The surface 202 has a roughness of at least about 8 Ra. Additionally, the surface 202 has a roughness of less than about 250 Ra. Accordingly, an increase in the localized high electric fields between different points on the insulating member 111 does not occur. The surface 202 is continuous. As any deposition occurs on the insulating member 111 instead of the electrode 108 and the insulating ring 110, increase of the corresponding electric field is mitigated, reducing arcing within the processing chamber. Additionally, the surfaces 202 and 203 are at least substantially concentric with each other such that the distance between the surfaces 202 and 203 is substantially equal across the entirety of the insulating member 111.

The height 210 of the insulating member 111 is at least equal to the combination of the height 214 of the electrode 108 and the height 212 of the insulating ring 110. Alternatively, the height 210 of the insulating member 111 may be greater than the combination of heights 212 and 214. In such an example, the insulating member 111 at least partially overlaps the liner 101 such at a bottom surface of the electrode 108 and the bottom surface of the insulating member 111 are not coplanar. The height of the insulating member 111 is in a range of about 10 mm to about 120 mm. Alternatively, the height of the insulating member 111 is less than about 10 mm or greater than about 120 mm. Further, the heights 212 and 214 may be similar to one another, or one or more of the heights 212 and 214 may be greater than the other one of the heights 212 and 214. Additionally, the width 220 of the insulating member 111 is in a range of about 1 mm to about 7 mm. Alternatively, the width of the insulating member 111 may be less than about 1 mm or greater than about 7 mm.

The insulating member 111 is positioned a distance (e.g., a vertical and/or horizontal distance) from the liner 101. For example, the distance may be less than about 1 mm. Alternatively, depending on the thickness and positioning of the liner 101, the distance may be greater than about 1 mm.

The liner 101 includes surface 230 and surface 232. The surfaces 230 and 232 are concentric with each other. For example, the distance between the surfaces 230 and 232 may be substantially equal across the entirety of the liner 101. Further, the width (e.g., distance between 230 and 232) of the liner 101 may be greater than the width 220 of the insulating member 111.

Figure 3:
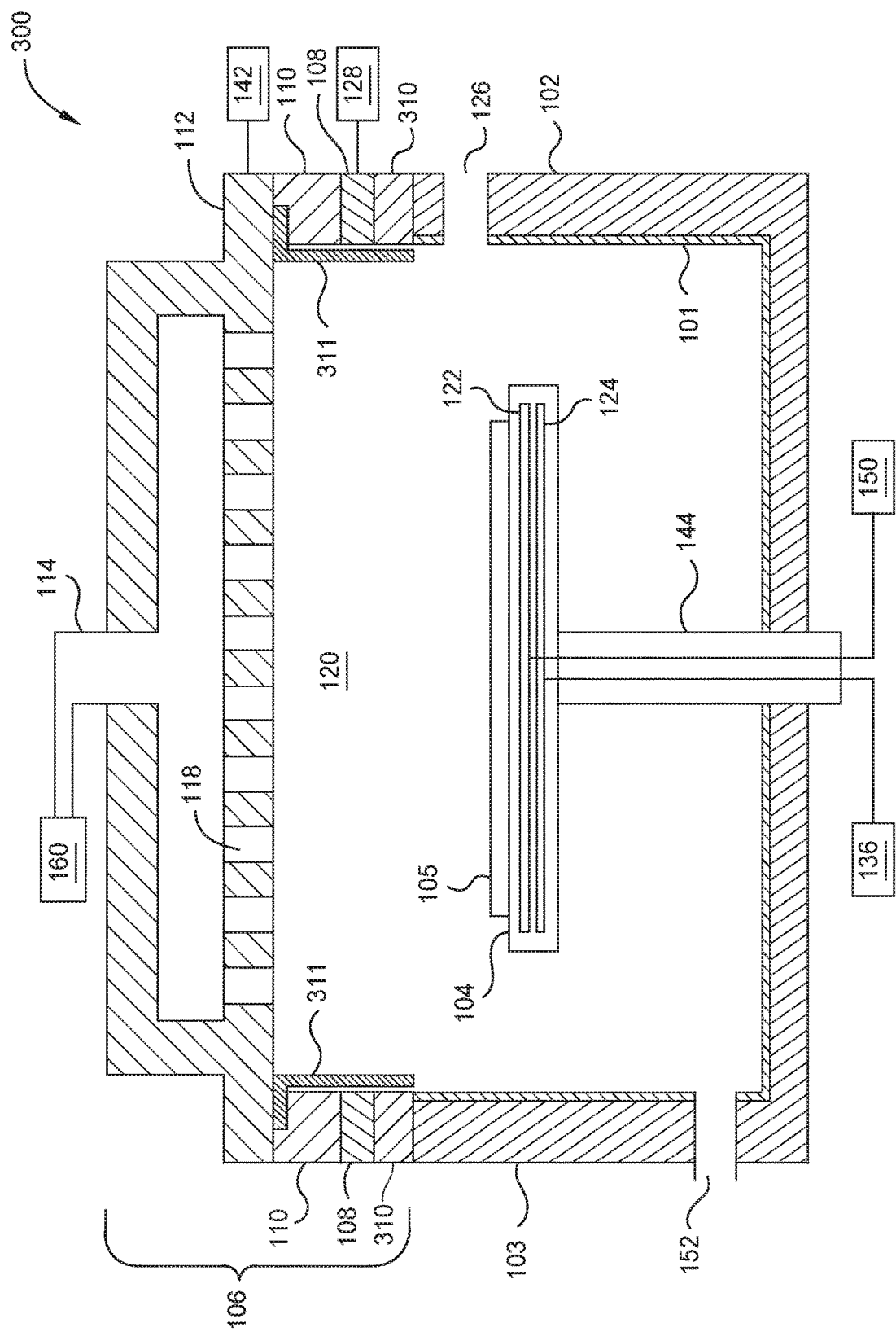
FIG. 3 is a schematic cross-sectional view of a processing system, according to one embodiment.

FIG. 3 is a schematic cross-sectional view of a process chamber 300, according to one or more embodiments. The process chamber 300 is configured similar to that of the process chamber 100; however, while the lid assembly 106 includes the electrode 108 and the insulating ring 110, the lid assembly 306 includes the insulating ring 110, the electrode 108 and an insulating ring 310. Alternatively, the lid assembly 306 may include additional electrodes 108. Further, the lid assembly 306 may include one or more insulating rings 110, one or more insulating rings 310 and/or one or more electrodes 108.

The insulating ring 310, which is a dielectric material such as a ceramic or metal oxide, for example aluminum oxide and/or aluminum nitride, contacts the electrode 108 and separates the electrode 108 electrically and thermally from the chamber body 102. Further, the insulating ring 310 is disposed between the electrode 108 and the chamber body 102.

The insulating member 311 of FIG. 3 is configured similar to that of the insulating member 111. The insulating member 311 is positioned between the insulating ring 110, the electrode 108, and the insulating ring 310 and the processing volume 120. Further, as is described with regard to FIG. 1, the insulating member 311 protects each of the insulating rings 110, 310 and the electrode 108, and a gap (at relative contact surfaces) between any of the insulating rings 110, 310 and the electrode 108, from the effects of process gases and thermal changes within the processing volume 120. For example, any material deposition occurs on the insulating member 311 instead of on the insulating rings 110 and 310 and the electrode 108 (or gaps at interfaces therebetween). In the example of FIG. 3, the insulating member 311 spans at least the combined height of the insulating rings 110, 310, and the electrode 108.

Figure 4:
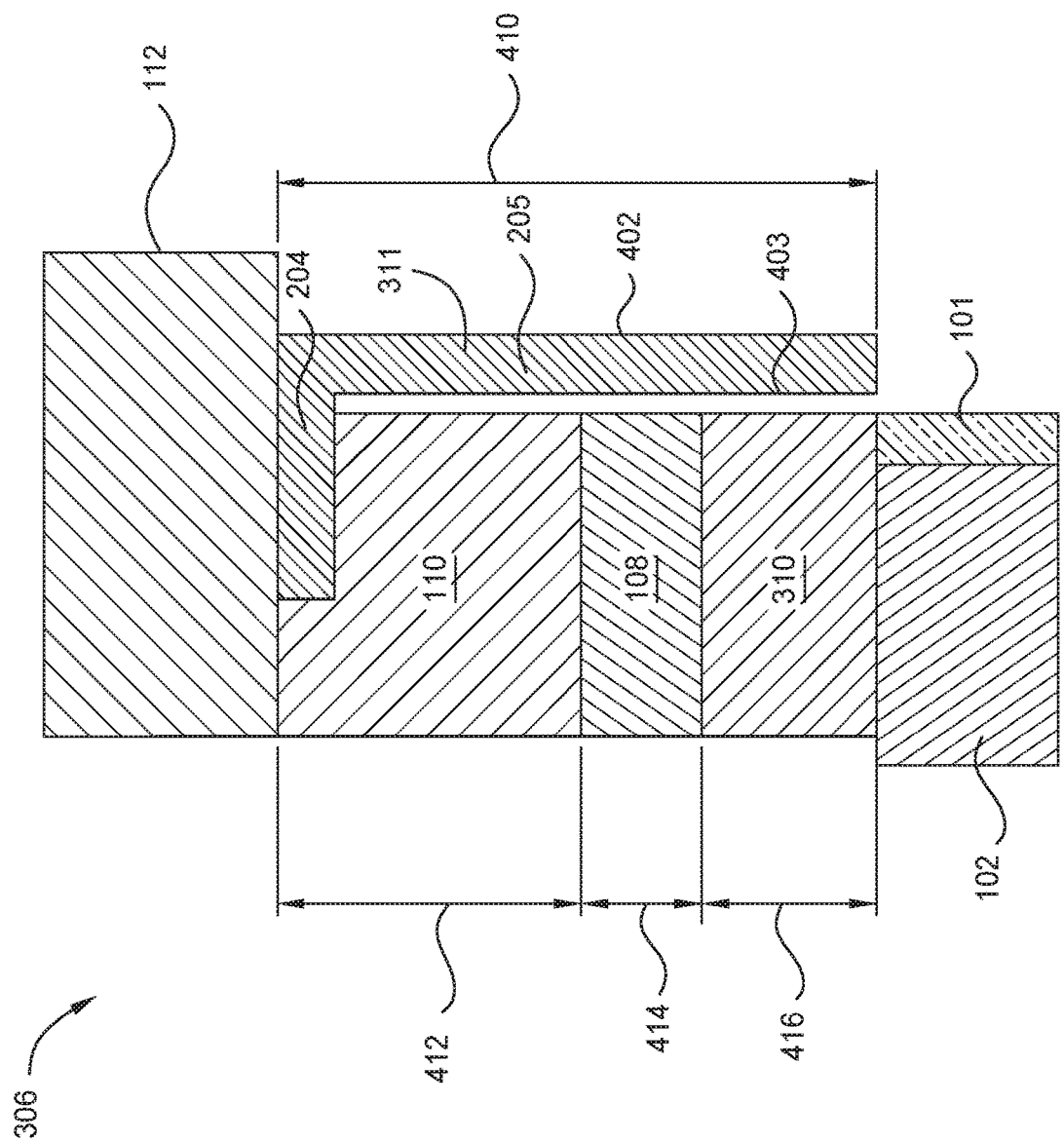
FIG. 4 is a schematic cross-sectional view of a portion of the processing system, according to one embodiment.

FIG. 4 is a schematic cross-sectional view of the portion 306 of the process chamber 300, according to one or more embodiments. The insulating member 311 includes surface 402 and surface 403. The surface 403 faces the electrode 108 and the insulating rings 110 and 310. Similar to that of insulating member 111, the insulating member 311 includes lip 204 that extends radially outward from a cylinder 205 of the insulating member 111 at a distal end of the cylinder 205. Further, the surface 403 does not contact the electrode 108 and the insulating rings 110, 310 such that a small gap of less than about 1 mm is formed between the surface 403 and the electrode 108 and the insulating rings 110, 310. In one embodiment, the surface 403 contacts the electrode 108 and the insulating rings 110, 310 and the gap is omitted. Omitting the gap may further prevent processing gases from contacting the electrode 108, and the insulating rings 110, 310, mitigating the deposition materials thereon. Additionally, the surface 402 faces the processing volume 120. During substrate processing, material deposition occurs on the surface 402 of the insulating member 311 instead of the electrode 108 and the insulating rings 110 and 310, and any gaps there between. Accordingly, the insulating member 311 protects the electrode 108 and the insulating rings 110 and 310 and any corresponding gaps therebetween from the process gases and thermal changes within the processing volume 120. The height 410 of the insulating member 311 is at least equal to the combination of the height 414 of the electrode 108, the height 412 of the insulating ring 110, and the height 416 of the insulating ring 310. Alternatively, the height 410 of the insulating member 311 may be greater than the combination of heights 412, 414 and 416. Further, the heights 412, 414 and 416 may be similar or one or more of the heights 412, 414 and 416 may be greater than another one of the heights 412, 414 and 416.

A processing system having a lid assembly with an insulating member positioned between the electrode and the insulating ring of the lid assembly and the processing volume is disclosed. The disclosed processing system experiences reduced material buildup on the electrode, the insulating ring and the gap between the electrode. Accordingly, the probability of the occurrence of arcing within the process chamber of the processing system is reduced, decreasing down time of the processing system and increasing the production rate of the processing system. Further, by reducing the thickness of the deposited material on the electrode, insulating ring and the gap between the electrode and insulating ring, the deposition capability of the corresponding processing system is increased.

While the foregoing is directed to embodiments of the disclosure, other and further embodiments of the disclosure may be devised without departing from the basic scope thereof.

What is claimed is:

1. A process chamber comprising:
   a chamber body;
   a substrate support positioned in the chamber body; and
   a lid assembly located over the chamber body and defining a processing volume within the chamber body, the lid assembly comprising:
     a faceplate;
     an electrode located between the faceplate and the chamber body; and
     an insulating member positioned radially inward from the electrode, between the electrode and the processing volume, and between the faceplate and the chamber body, wherein the insulating member does not contact the electrode.

2. The process chamber of claim 1, wherein the lid assembly further comprises:
   an insulating ring positioned between the faceplate and the chamber body.

3. The process chamber of claim 2, wherein the insulating member is further positioned between the insulating ring and the processing volume.

4. The process chamber of claim 1 further comprising a liner positioned on a surface of the chamber body, and wherein the insulating member is separated from the liner.

5. The process chamber of claim 1, wherein the insulating member is coupled to the faceplate.

6. The process chamber of claim 1, wherein the insulating member comprises a ceramic.

7. The process chamber of claim 1, wherein the insulating member comprises a continuous ring.

8. The process chamber of claim 1, wherein a thickness of the insulating member is in a range of about 1 mm to about 7 mm.

9. A lid assembly for a processing system, the lid assembly comprising:
a faceplate;
an electrode disposed between the faceplate and a chamber body of the processing system; and
an insulating member positioned between radially inward from the electrode, wherein the insulating member does not contact the electrode.

10. The lid assembly of claim 9 further comprising:
an insulating ring disposed between the faceplate and the electrode.

11. The lid assembly of claim 10, wherein the insulating member is further positioned radially inward from the insulating ring.

12. The lid assembly of claim 11, wherein the insulating member is separated from the electrode and the insulating ring by a gap.

13. The lid assembly of claim 12, wherein the gap is at least about 1 mm.

14. The lid assembly of claim 9, wherein the insulating member comprises a ceramic.

15. The lid assembly of claim 9, wherein the insulating member comprises a continuous ring.

16. The lid assembly of claim 9, wherein a thickness of the insulating member is in a range of about 1 mm to about 7 mm.

17. A process chamber comprising:
a chamber body;
a substrate support located in the chamber body, the substrate support comprising a first electrode; and
a lid assembly positioned over the chamber body and defining a processing volume within the chamber body, the lid assembly comprising:
a faceplate;
a second electrode positioned between the faceplate and the chamber body; and
an insulating member positioned radially inward from the second electrode, between the second electrode and the processing volume and between the faceplate and the chamber body, wherein the insulating member does not contact the electrode.

18. The process chamber of claim 17, wherein the lid assembly further comprises:
an insulating ring positioned between the faceplate and the chamber body, and wherein the insulating member is further positioned between the insulating ring and the processing volume.

19. The process chamber of claim 17, wherein a thickness of the insulating member is in a range of about 1 mm to about 7 mm.

20. The process chamber of claim 17, wherein a liner is formed on the chamber body and the insulating member is separated from the liner.

* * * * *